(12) United States Patent
Cheong

(10) Patent No.: US 6,933,228 B2
(45) Date of Patent: Aug. 23, 2005

(54) METHOD OF MANUFACTURING OF CONTACT PLUG IN A CONTACT HOLE ON A SILICON SUBSTRATE

(75) Inventor: Woo Seock Cheong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 307 days.

(21) Appl. No.: 10/034,228

(22) Filed: Dec. 28, 2001

(65) Prior Publication Data

US 2003/0087512 A1 May 8, 2003

(30) Foreign Application Priority Data

Oct. 12, 2001 (KR) ........................................ 2001-63059

(51) Int. Cl.[7] .............................................. H01L 23/52
(52) U.S. Cl. ........................ 438/637; 438/597; 438/618
(58) Field of Search ................................ 438/637, 597, 438/618

(56) References Cited

U.S. PATENT DOCUMENTS

| | | |
|---|---|---|
| 5,073,516 A | 12/1991 | Moslehi |
| 5,273,921 A | 12/1993 | Neudeck et al. |
| 5,321,306 A | 6/1994 | Choi et al. |
| 5,434,092 A | 7/1995 | Neudeck et al. |
| 5,604,368 A | 2/1997 | Taur et al. |
| 5,804,470 A | 9/1998 | Wollesen |
| 5,895,948 A | 4/1999 | Mori et al. |
| 5,955,759 A | 9/1999 | Ismail et al. |
| 6,030,894 A | 2/2000 | Hada et al. |
| 6,090,691 A | 7/2000 | Ang et al. |
| 6,150,190 A | 11/2000 | Stankus et al. |
| 6,297,162 B1 * | 10/2001 | Jang et al. .................. 438/706 |
| 2001/0036730 A1 * | 11/2001 | Kim ............................ 438/689 |

FOREIGN PATENT DOCUMENTS

| | | |
|---|---|---|
| JP | 59082768 | 5/1984 |
| JP | 59165461 | 9/1984 |
| JP | 59165462 | 9/1984 |
| JP | 59165463 | 9/1984 |
| JP | 59165464 | 9/1984 |
| JP | 59165465 | 9/1984 |
| JP | 59189677 | 10/1984 |
| JP | 61006195 | 1/1986 |
| JP | 63164355 | 7/1988 |
| JP | 2130919 | 5/1990 |
| JP | 7130682 | 5/1995 |
| JP | 10107219 | 4/1998 |

* cited by examiner

*Primary Examiner*—Hoai Pham
*Assistant Examiner*—Anh D. Mai
(74) *Attorney, Agent, or Firm*—Ladas & Parry

(57) ABSTRACT

A method of manufacturing a semiconductor device comprising the steps of: forming an insulating layer on a silicon substrate; forming a contact hole on the insulating layer; forming a nitride layer on the side of the contact hole; and forming a selective conductive plug in the contact hole including the nitride layer.

25 Claims, 15 Drawing Sheets

Silicon on oxide

Surface structure

METHOD OF MANUFACTURING OF CONTACT PLUG IN A CONTACT HOLE ON A SILICON SUBSTRATE

BACKGROUND OF THE INVENTION

1. Field of the Invention

The present invention relates generally to a method of manufacturing a semiconductor device, and more particularly, to a method of manufacturing a semiconductor device with an improved contact plug suitable for highly integrated semiconductor devices.

2. Description of the Related Art

As is well known, it is essential to reduce contact resistance in a semiconductor IC circuit line width to below 0.16 $\mu$m.

According to recent methods of forming a silicon contact plugs, a contact hole is formed and then, polycrystalline silicon is deposited therein. A planation process is performed by using chemical mechanical polishing (CMP).

Generally, it is desirable to apply silicon epitaxial growth (SEG) during the manufacturing process of semiconductor devices since it is possible to reduce cell size, simplify the manufacturing process and improve electrical properties by SEG.

Therefore, a plug using SEG can solve the problems of gap-fill and increases of contact resistance, due to reduced cell size.

It is also possible to simplify the manufacturing process since CMP and silicon recess etch are not required to be performed for plug isolation.

However, there are several problems in applying SEG during plug formation.

First, there is the problem of selectively of the pattern material, that is, a material forming a window to grow the SEG.

The surface of the nitride layer is exposed when a self-aligned contact (SAC) etch is applied to the cell activation regions. The SEG has a different facet generation due to selectivity and thermal stress, and according to the pattern material.

Generally, in a low pressure chemical vapor deposition (LPCVD) process, nitride materials have difficulty in achieving selectivity at temperatures below 850° C., compared with oxide materials.

Therefore, the growth speed is lowered in order to have selectivity, thereby increasing thermal growth on the surface of the device.

The conventional method for manufacturing a semiconductor device will be described in more detail with reference to the accompanying drawings.

FIGS. 1 to 4 are cross sectional views for showing a conventional method of manufacturing a semiconductor device.

Referring to FIG. 1, a gate electrode 3 is formed on a silicon substrate 1 and then, a sidewall spacer 5 is formed on the side of the gate electrode 3.

Although it is not shown in the drawings, impurity junction regions are formed by implanting impurities in the silicon substrate 1 on the lower parts of both sides of the sidewall spacer 5.

Subsequently, an interlayer insulating layer 7 is deposited on the silicon substrate 1 including over the gate electrode 3 and the sidewall spacer 5.

Referring to FIG. 2, the interlayer insulating layer 7 is subjected to a mask formation process using lithography and patterning processes to form a plug contact hole 9 exposing the impurity junction regions (not shown).

Referring to FIG. 3, an amorphous silicon layer 11 is deposited to fill the plug contact hole 9 on the upper part of the interlayer insulating layer 7 including the plug contact hole 9.

Then, a CMP or silicon recess etch process is performed on the amorphous silicon layer 11, thereby forming a contact plug 11a in the plug contact hole 9, to electrically contact the impurity junction regions (not shown).

However, the conventional method has several problems in forming the contact hole and the contact plug having a high aspect ratio, and especially when the circuit line width is below 0.16 $\mu$m.

First, according to the conventional method, in order to form a plug with silicon, CMP or a silicon recess etch is required to be performed on the oxide layer, followed by contact hole formation, amorphous silicon deposition and plug isolation. Therefore, a problem arises in higher production costs.

It is also difficult to prevent generation of natural oxide layers on the interface of the cell and plug since in-situ cleaning is not performed in a tube type LPCVD. Therefore, contact resistance of the polycrystalline silicon plug is increased by three times more than that of selective epitaxial growth (SEG).

Also, there is a problem of gap-fill in silicon deposition due to reduced contact hole size and increased aspect ratio.

Moreover, compared with a SEG (epitaxial layer), diffusion of phosphorus is increased in the high doped amorphous or polycrystalline silicon, thereby deteriorating the device properties.

Although it is not shown in the drawings, another alternative embodiment of the conventional method will be described in the following description.

According to the alternative embodiment, an interlayer insulating layer (not shown) is first deposited using a nitride material on a silicon substrate (not shown) having a gate electrode and impurity junction regions.

Then, a contact hole (not shown) is formed to expose the impurity junction regions (not shown) by selectively patterning the interlayer insulating layer (not shown).

Subsequently, a SEG plug is formed in the contact hole (not shown), maintaining selectivity with the interlayer insulating layer (not shown) pattern of nitride material.

This alternative embodiment has the advantages of reducing contact resistance and simplifying the plug formation process by using selective epitaxial growth.

However, when a LPCVD method is applied to the conventional method, HCl is increased in order to maintain selectivity on the surface of the nitride layer, thereby lowering the growth speed of SEG.

The nitride material has a thermal coefficient of expansion (TCE) higher than that of silicon, thereby generating defects of SEG due to the difference in thermal expansion.

It is difficult to have a processing margin on the surface of the nitride layer during a process of applying a UVH-CVD method.

Moreover, in the nitride layer pattern, regions having selectivity are decreased by ten times compared to in the oxide layer, at temperatures below 900° C.

When a SEG is formed, the nitride pattern generates defects at a higher temperature than that of the oxide layer.

It is also difficult to maintain selectivity of the nitride layer in-situ. Even if the selectivity is maintained, it is impossible to prevent a decrease in growth speed.

As a result, the thermal budget of SEG is increased and the device properties are deteriorated.

Moreover, overgrowth of SEG may be generated according to the density and shape of the cell pattern, thereby generating problems during CMP on the interlayer insulating layer.

SUMMARY OF THE INVENTION

The present invention solves the above mentioned problems. One object of the present invention is to provide a method of manufacturing a semiconductor device with an improved contact plug suitable for highly integrated semiconductor devices.

Another object of the present invention is to provide a method of manufacturing a semiconductor device capable of simplifying the manufacture processes by applying SEG during plug formation.

Yet another object of the present invention is to provide a method of manufacturing a semiconductor device capable of reducing the contact resistance of the plug in forming the contact plug.

Still another object of the present invention is to provide a method of manufacturing a semiconductor device capable of reducing production costs by minimizing the amount of silicon source for gap fill of the silicon plug.

And, still another object of the present invention is to provide a method of manufacturing a semiconductor device capable of minimizing the processing time of the plug by increasing the growth speed of the polycrystalline silicon on the sidewall of the contact hole.

In order to accomplish the above objects, the present invention comprises the steps of: forming an insulating layer on a silicon substrate; forming a contact hole on the insulating layer; forming a nitride layer on the side of the contact hole; and forming a selective conductive plug in the contact hole including the nitride layer.

Prior to forming the insulating layer, the present invention further comprises the steps of: forming a gate structure on the silicon substrate; forming an insulating layer spacer on the gate structure; and forming an oxide layer on the insulating layer spacer on the gate structure.

The step of oxide layer formation comprises the steps of forming an oxide layer on the whole structure, including over the insulating layer spacer, and selectively removing the oxide layer by using a wet etch process so that only the insulating layer spacer on the gate structure remains.

The selectively conductive plug comprises a selective single crystal silicon growth on the surface of silicon substrate and selective polycrystalline silicon on the nitride layer of side of the contact hole.

The present invention further comprises the step of performing a plasma treatment on the silicon substrate having the nitride layer.

The present invention still further comprises the step of performing a wet cleaning processes on the plasma-treated silicon substrate.

The above objects, and other features and advantages of the present invention will become more apparent after reading the following detailed description when taken in conjunction with the accompanying drawings.

BRIEF DESCRIPTION OF THE INVENTION

DETAILED DESCRIPTION OF THE INVENTION

Figure 1:
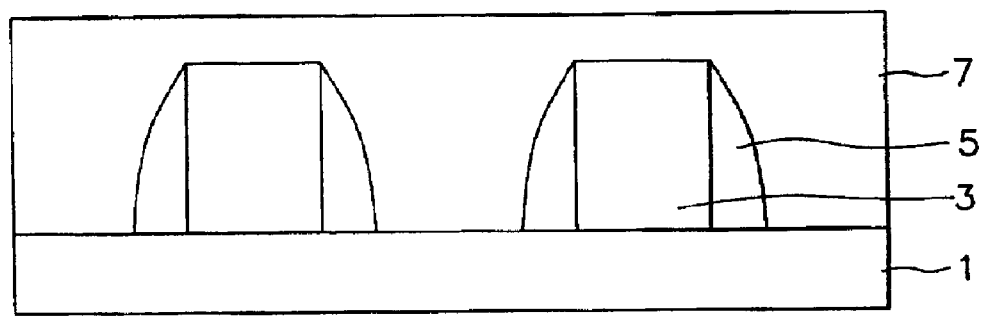
FIGS. 1 to 4 are cross sectional views showing the steps of a conventional method of manufacturing a semiconductor device.
Figure 2:
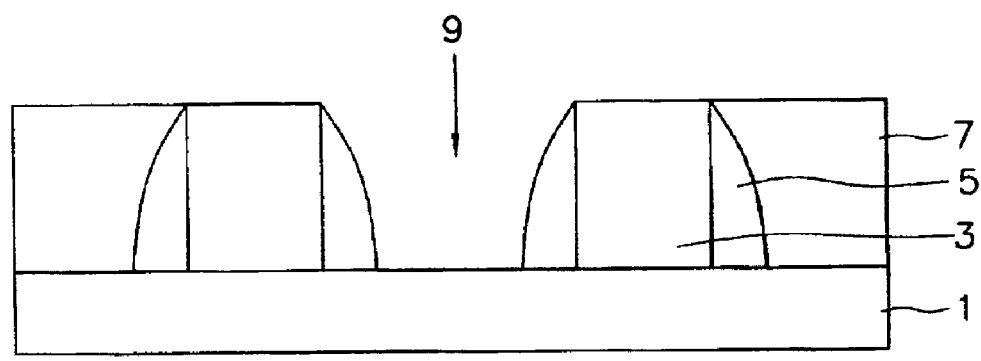
Figure 3:
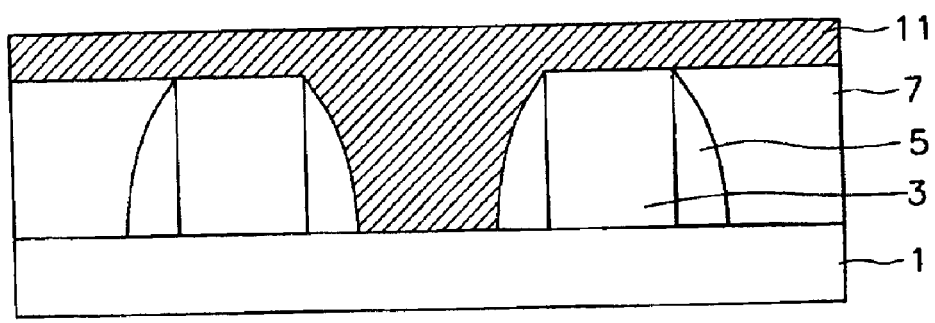
Figure 4:
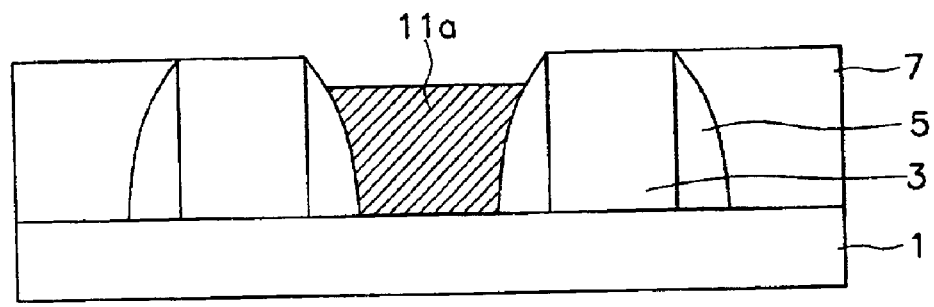
Figure 5:
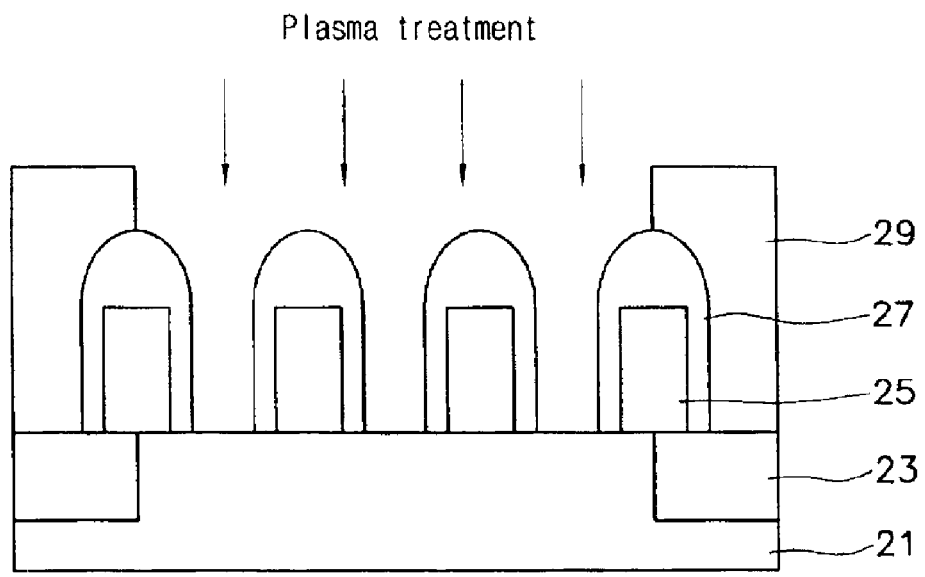
FIGS. 5 to 7 are cross sectional views showing the steps of a method of manufacturing a semiconductor device according to an embodiment of the present invention.

Referring now to FIG. 5, first, a trench isolation layer 23 is formed to define a device active formation region and a device isolation region on a silicon substrate 21.

Subsequently, a gate insulating layer (not shown) and a gate structure 25 are formed on the device formation region of the silicon substrate 21 and an insulating layer, such as a nitride layer (not shown), is deposited on the silicon substrate 21, including over the gate structure. Then, the nitride layer is selectively removed by using an anisotropic etch process, the nitride layer remaining only on the upper part and side of the gate structure 25, thereby forming an insulating layer spacer 27.

Impurity junction regions for source and drain (not shown) are formed by implanting impurities on the lower parts of the silicon substrate 21 adjacent both sides of the insulating layer spacer 27 on.

Then, an insulating layer (not shown) is deposited on the resulting structure, including over the insulating layer spacer 27, and a contact hole (not shown) is formed to expose the silicon substrate 21 on the lower part of the insulating layer spacer 27 by selectively patterning the insulating layer. The contact hole (not shown) is formed in accordance with SAC.

Subsequently, the resulting structure is subjected to a dry cleaning process by plasma treatment. The plasma treatment comprises a post etch treatment and a dry cleaning process.

Processing gases, such as $NF_3$ and $O_2$, are added to the plasma treatment in order to remove a damage layer, including carbon on the activation region of the silicon substrate. The plasma treatment is performed by supplying $NF_3+O_2$ processing gas, wherein the flow rate of $NF_3$ is between 10 and 100 sccm, that of the $O_2$ is between 30 and 300 sccm, that of the He is between 100 and 2000 sccm, at a power of between 1 and 200 Watts (W), a pressure of between 1 mTorr and 10 Torr, and a temperature of about 200° C. As a result of the plasma treatment, any damage of the silicon substrate is lowered to below 50 Å.

Figure 6:
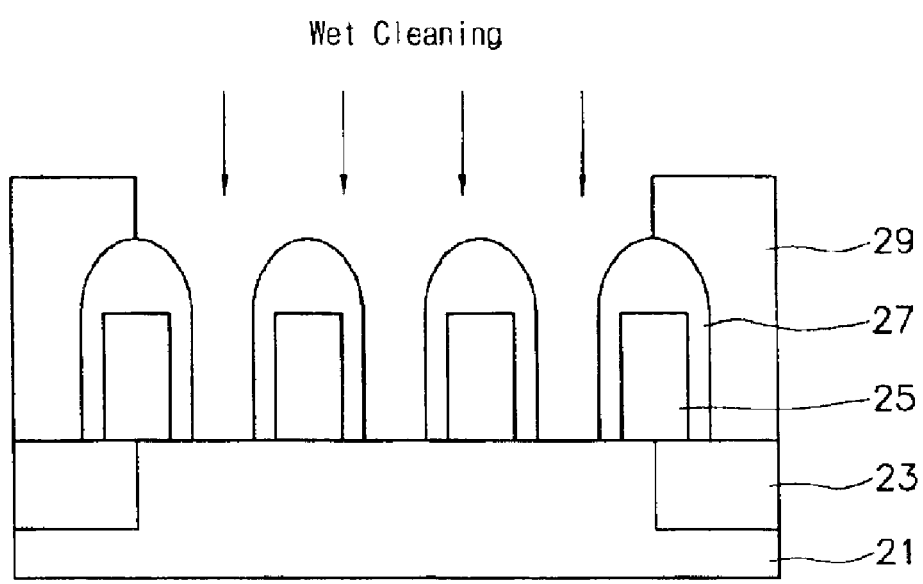

Referring to FIG. 6, a wet cleaning process is performed on the resulting structure after the plasma treatment. It is desirable to perform the wet cleaning process without delay after the plasma treatment in order to prevent generation of natural oxide layers. The silicon surface is subjected to H passivation after the wet cleaning process is performed.

The wet cleaning process comprises two steps, wherein the first step is performed in order to remove organic impurities, under the conditions that $H_2SO_4$ and $H_2O_2$ solutions are maintained at the ratio of between 1:1 to 100:1 and the temperature is between 80 and 120° C., for about 1 to 20 minutes. The second step is performed in order to remove oxide layers on the surface of the silicon substrate with a HF solution diluted in distilled water at the ratio of between 100:1 and 500:1. Here, the etch target of the oxide layer is in the range of between 20 and 50 Å.

Figure 7:
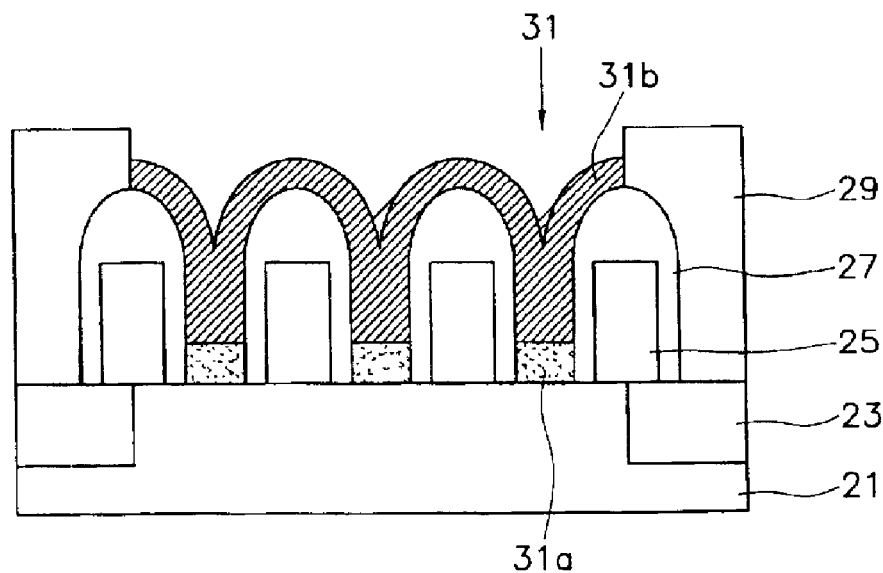

Referring to FIG. 7, a selective silicon plug 31 is grown in the contact hole (not shown), including over the exposed surface of the silicon substrate 21, on the side of the contact hole (not shown). The selective silicon plug 31 is grown by using LPCVD or ultra-high vacuum chemical vapor deposition (UHVCVD).

In order to grow a selective single crystal silicon SEG by the LPCVD, a DCS-$H_2$—HCl gas system or MS-$H_2$—HCl gas system is applied, similar to a Si—H—Cl system.

When the DCS-$H_2$—HCl gas system is applied, the temperature is between 750 and 850° C., the pressure is between 5 to 760 Torr, the flow rate of DCS is between 0.1 and 1 slm, the flowrate of HCl is between 0.1 and 1.0 slm, and the flowrate of $H_2$ is between 30 and 150 slm.

When the MS-$H_2$—HCl gas system is applied, the temperature is between 750 and 850° C., the pressure is between 5 and 760 Torr, the flow rate of MS is between 0.1 and 1.0 slm, the flowrate of HCl is between 0.5 and 5.0 slm, and the flowrate of $H_2$ is between 30 and 150 slm.

In both cases, between 1 and 10% $PH_3/H_2$ is supplied at a flowrate of between 0.1 and 1.5 slm for an in-situ doping process. The SEG growth target is about 60 to 100% of the width of the gate distance. For example, when a width of the gate distance is 1000 Å, the SEG growth target is preferably between 600 and 1000 Å.

Therefore, a single crystal silicon 31a is grown on the surface of the silicon substrate 21 and a polycrystalline silicon 31b is grown on the nitride layer spacer 27 of the side of the contact hole. The contact hole is desirably filled by combining the single crystal silicon and the polycrystalline silicon.

When the selective silicon plug 31 is formed by UHVCVD, incubation thickness is a maximum thickness of SEG that silicon nucleation generates on the oxide layer pattern in the SEG deposition process. The incubation thickness is generally between 800 and 1200 Å.

The thickness of SEG is increased by adding $Cl_2$ gas, however, the growth speed is consequently lowered.

Therefore, according to the UHVCVD, $Cl_2$ can be added in order to increase the processing margin since a maximum growth speed is realized by using the incubation thickness.

The selective silicon plug 31 is deposited by using a $Si_2H_6+Cl_2+H_2$ system, wherein flow rates thereof are between 1 and 10 sccm, 0 and 5 sccm, and 0 and 20 sccm, respectively. The deposition process is performed in-situ by using $H_2$ gas, including between 1 and 10% $PH_3$ at a temperature of between 600 and 800° C. and at a pressure of between 1 and 50 mTorr.

In order to improve selectivity on the PE-USG oxide layer and increase the growth speed, $GeH_4$ may be added in the deposition of the selective silicon plug 31. The $GeH_4$ is desirably supplied at a flow rate up to 10 sccm and the growth thickness thereof is between 60 and 100% of the width of the contact hole (not shown).

FIGS. 8 to 11 are preferred layouts showing the source/drain ion implantation processes after the selective silicon plug 31 is formed.

Figure 8:
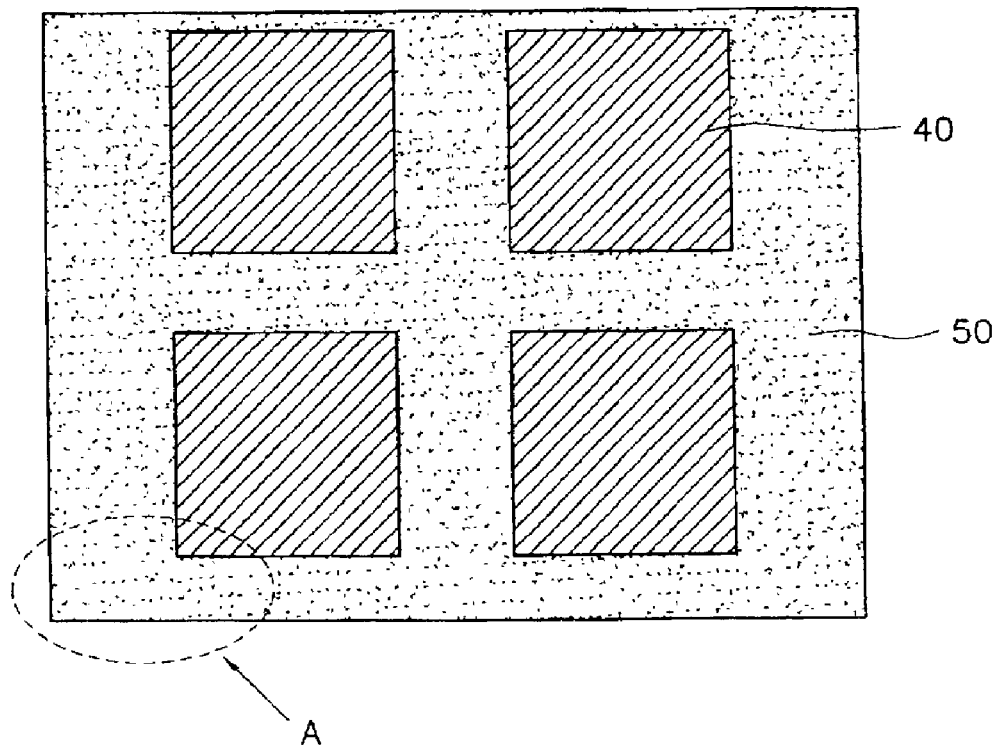
FIG. 8 is a layout showing a BPSG layer filled between the cells according to the present invention.

FIG. 8 is a layout showing the BPSG layer 50 filled between cells 40.

Figure 9:
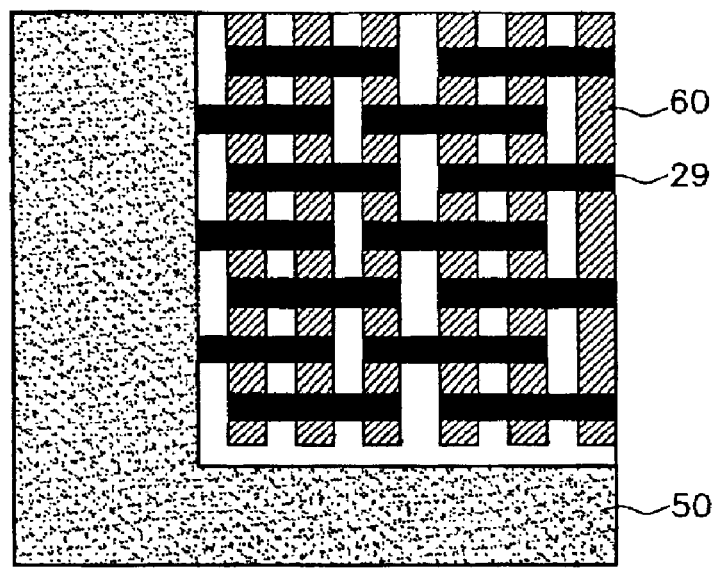
FIG. 9 is an enlarged layout of "A" shown in FIG. 8, showing a block of cells made according to the present invention.

FIG. 9 is an enlarged layout of a block of the cell 40 containing an isolating layer 20 and a word line 60, and a BPSG layer 50.

Figure 10:
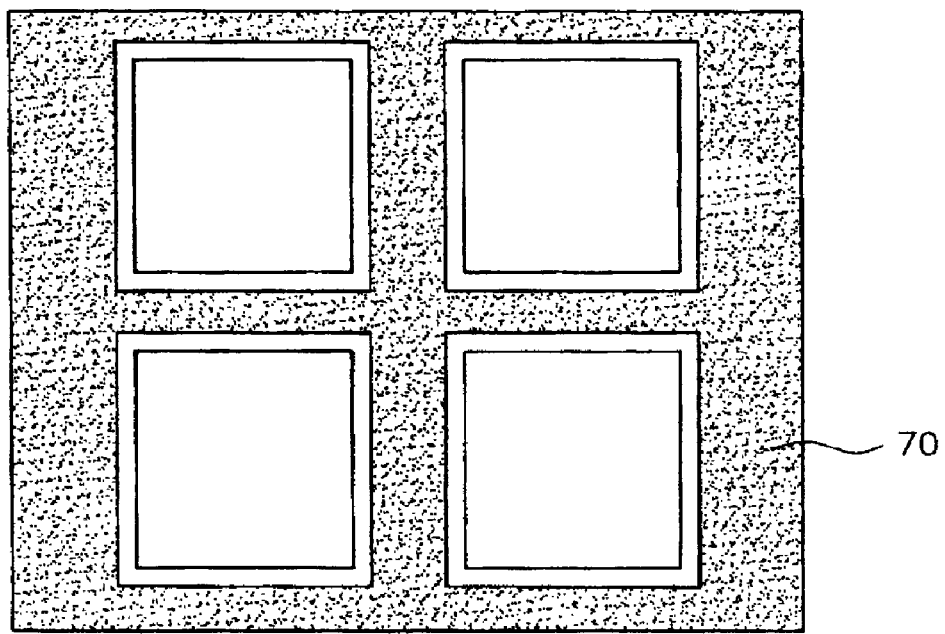
FIG. 10 is a layout showing a sensitive film pattern PR after performing exposure and development processes by using a mask slightly larger than the cell block made according to the present invention.

FIG. 10 is a layout showing a sensitive film pattern PR after exposure and development are performed with a mask 70 slightly larger than the cell block. A spin wet etcher is then employed to remove the oxide layer around cells.

Although it is not shown in the drawings, the nitride layer is removed and source/drain ion implantation processes are performed to form the source/drain (not shown) on the silicon substrate.

Then, a high density plasma oxide (HDP) layer (not shown) is deposited and a planation process is performed on the oxide layer by using CMP.

Figure 11:
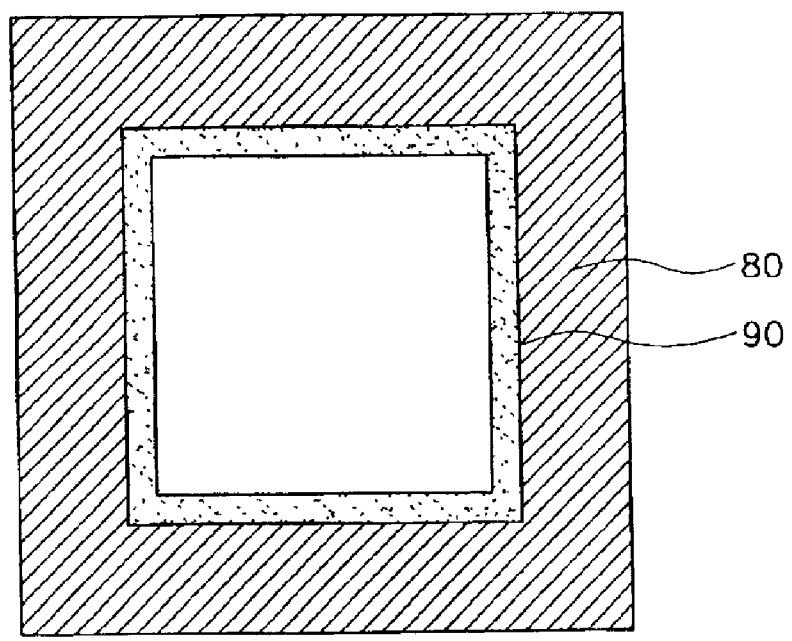
FIG. 11 is a layout showing an interlayer insulating layer and a nitride layer on the outer part of cell block made according to the present invention.

FIG. 11 is a layout showing a nitride layer 80 and an interlayer insulating layer 90 remaining on the outer part thereof according to the present invention.

It is thus possible to obtain desirable conditions of gap-fill and growth target in the contact hole.

Other embodiments of the present invention will be described with reference to accompanying drawings.

FIGS. 12 to 17 are cross sectional views showing the steps of a method of manufacturing a semiconductor device according to other embodiments of the present invention.

Figure 18:
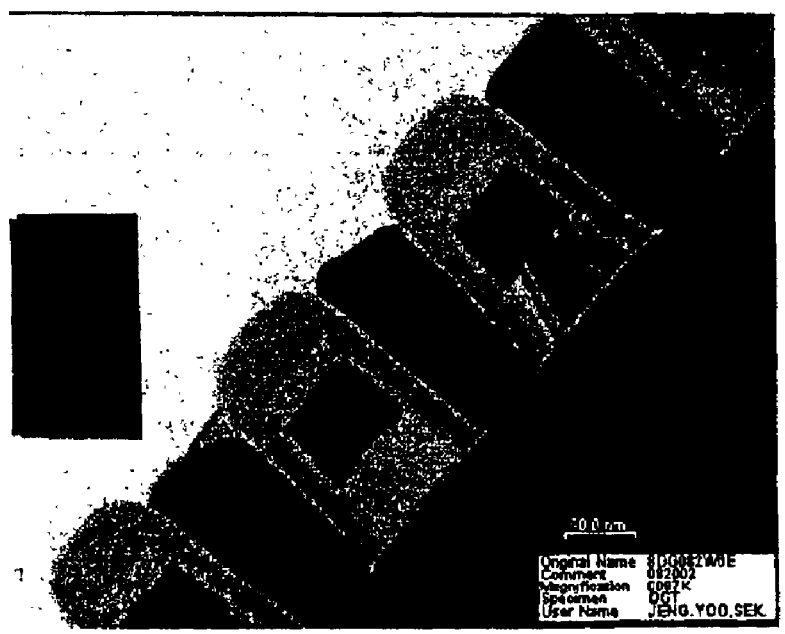
FIGS. 18 and 19 are TEM photographs of formation process sections of a selective silicon plug according to another embodiment of the present invention.
Figure 19:
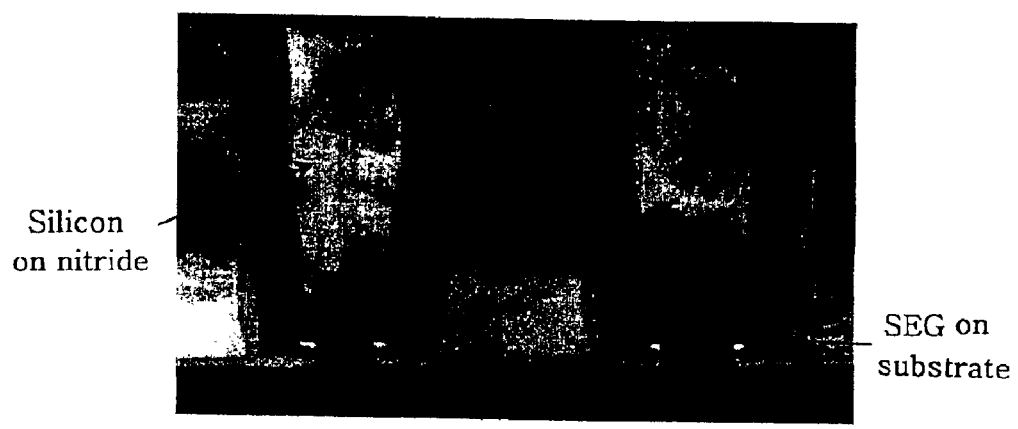

FIGS. 18 and 19 are TEM photographs of formation process sections of a selective silicon plug according to another embodiment of the present invention.

Figure 20:
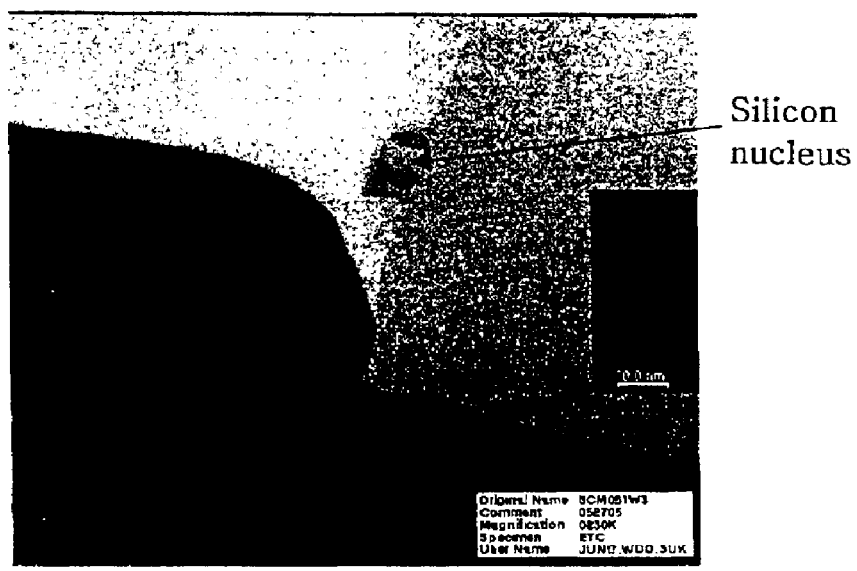
FIG. 20 is a TEM photograph showing the time of nucleation generation on the oxide layer pattern in the selective single crystal silicon growth by using UHVCVD, according to another embodiment of the present invention.

FIG. 20 is a TEM photograph showing the time of nucleation generation on the oxide layer pattern in the selective single crystal silicon growth by using UHVCVD, according to this other embodiment of the present invention.

Figure 21:
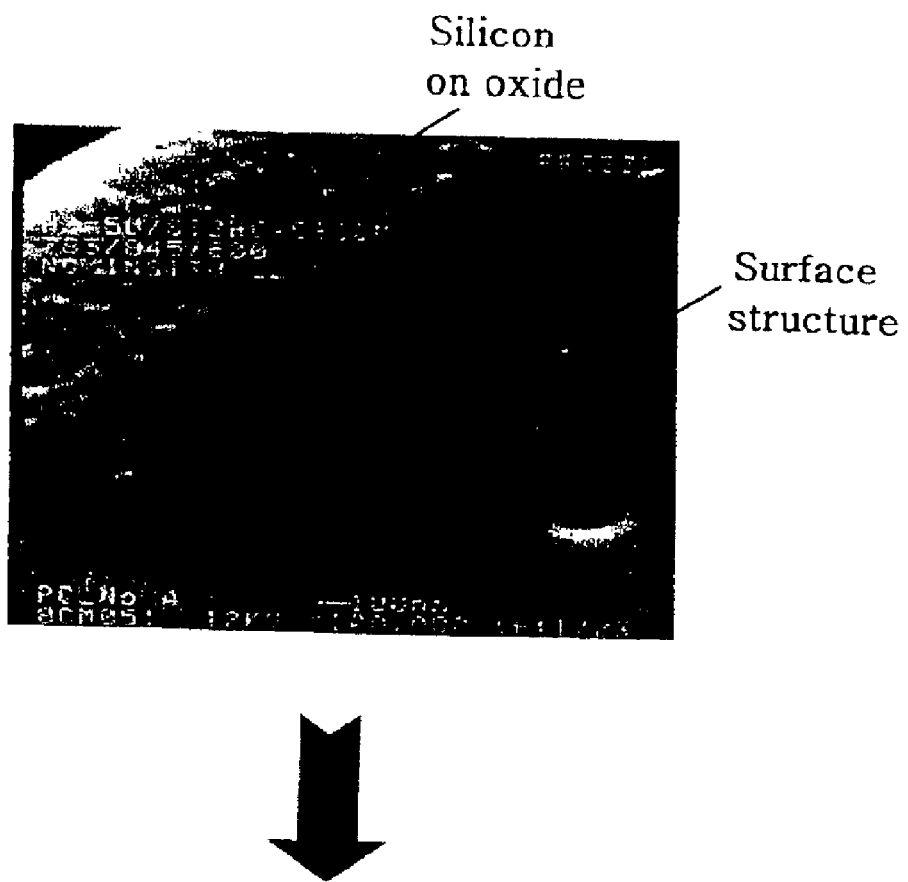
FIG. 21 is a TEM photograph showing silicon growth and surface structure on the oxide layer pattern according to another embodiment of the present invention.
Figure 21:
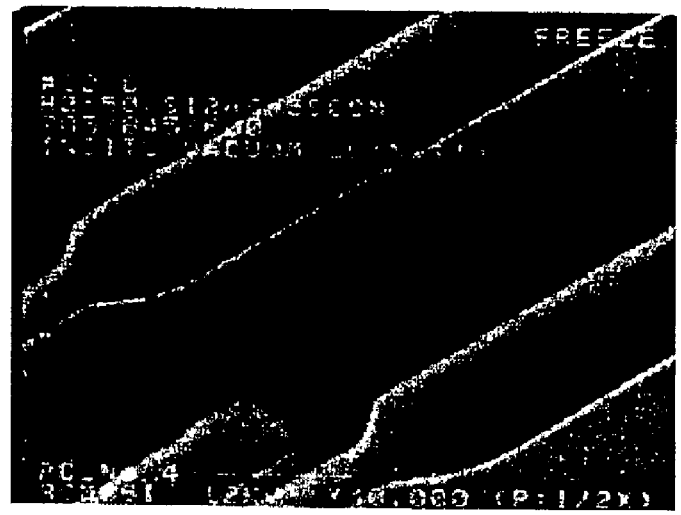

FIG. 21 is a TEM photograph showing silicon growth and surface structure on the oxide layer pattern according to this other embodiment of the present invention.

Figure 22:
FIGS. 22 and 23 are TEM photographs showing formation process sections of a selective silicon plug according to a third embodiment of the present invention.
Figure 23:

FIGS. 22 and 23 are TEM photographs showing formation process sections of a selective silicon plug according to another third embodiment of the present invention.

Figure 12:
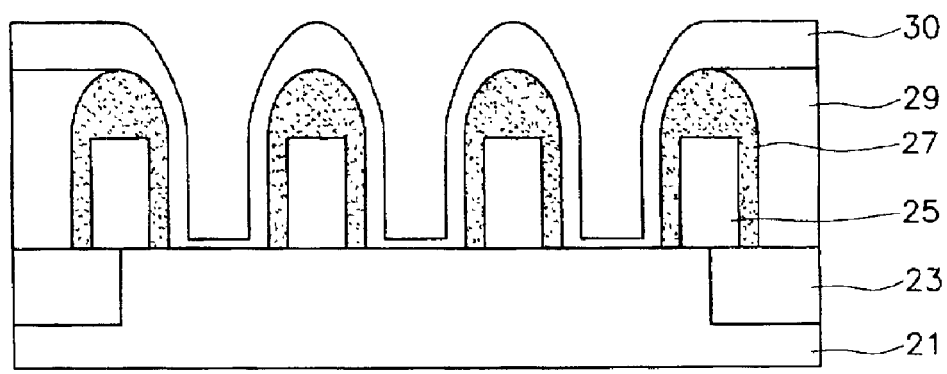
FIGS. 12 to 14 are cross sectional views showing the steps of a method of manufacturing a semiconductor device according to another embodiment of the present invention.

Referring to FIG. 12, first, a trench isolation layer 23 is formed to define a device active formation region and a device isolation region on a silicon substrate 21.

Subsequently, a gate insulating layer (not shown) and a gate structure 25 are formed on the device formation region of the silicon substrate 21 and an insulating layer, such as nitride layer (not shown), is deposited on the silicon substrate 21 including the gate structure 25. Then, the nitride layer is selectively removed by using an anisotropic etch process, thereby forming an insulating layer spacer 27 on the exposed surface of the gate structure 25. The insulating layer spacer 27 is formed on the upper part and the side of the gate structure 25.

Impurity junction regions (not shown) are formed by implanting impurities on the silicon substrate 21 on the lower parts of both sides of the insulating layer spacer 27.

Then, an insulating layer 29 is deposited on the resulting structure, including over the insulating layer spacer 27, and a contact hole (not shown) is formed to expose the silicon substrate 21 on the lower part of the insulating layer spacer 27 by selectively patterning the insulating layer by using SAC.

A PE-USG oxide layer 30 is deposited to a thickness of between 300 to 1000 Å on the resulting structure, including the over insulating layer spacer 27. Here, step coverage is required to be maintained below 50%.

When the PE-USG oxide layer 30 is deposited, a source gas, selected from one of a group comprising $SiH_4$, $N_2O$ and He, is supplied at a pressure of between 0.1 and 50 Torr, a temperature of between 350 and 550° C., and the power at between 100 and 1000 W.

Figure 13:
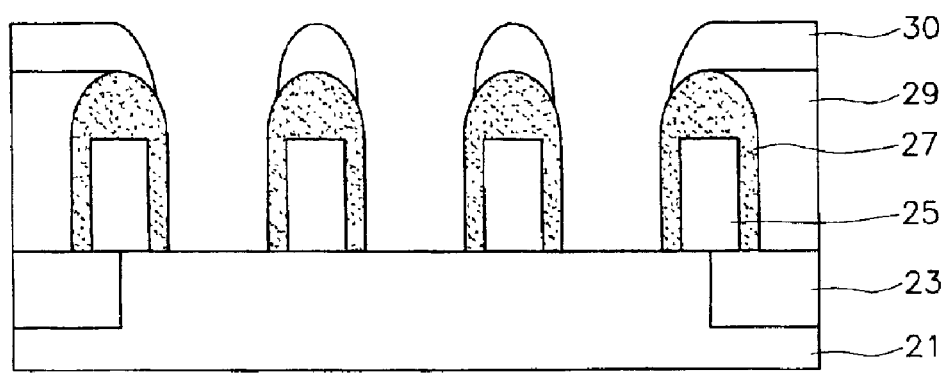

Referring to FIG. 13, the PE-USG oxide layer 30 is selectively removed by using a wet etch process so that 200~400 Å on the upper part of the nitride layer spacer 27 remains on the gate structure 25, and thereby exposing the surface of the nitride layer spacer 27 on the side of the contact hole (not shown) and exposing a part of the silicon substrate on the lower part of the contact hole.

The etch process of the PE-USG oxide layer 30 is performed at a temperature of between 50 and 100° C. in distilled water (DI) of 50 to 500 times dilution level by using a diluted HF solution. For example, when a PE-USG layer, having step coverage of 50%, is deposited to a thickness of 600 Å, the wet etch target is between 300 to 400 Å.

When the bottom of the contact hole is not opened after the wet etch process, a reactive ion etch process is additionally performed to between 50 and 150 Å according to the profile of the PE-USG oxide layer 30.

Then, an in-situ cleaning process is performed prior to formation of the selective silicon plug. The in-situ cleaning process is performed to remove the oxide layer on the substrate interface by raising the temperature in the Hydrogen flow.

It is desirable to perform the cleaning process by using a Rapid Thermal Processing (RTP) method in consideration of the processing time and thermal budget. It is also possible to employ a Hydrogen bake method. The RTP method is performed by instantaneously raising the temperature to 950° C. (ramping rate being over 10° C./sec) and then, rapidly cooling to the temperature of the selective silicon growth, that is, to between 550 and 630° C.

The Hydrogen bake is performed by using an annealing process at a temperature of between 750 and 950° C. in an atmosphere of Hydrogen for between 30 and 150 seconds.

Figure 14:
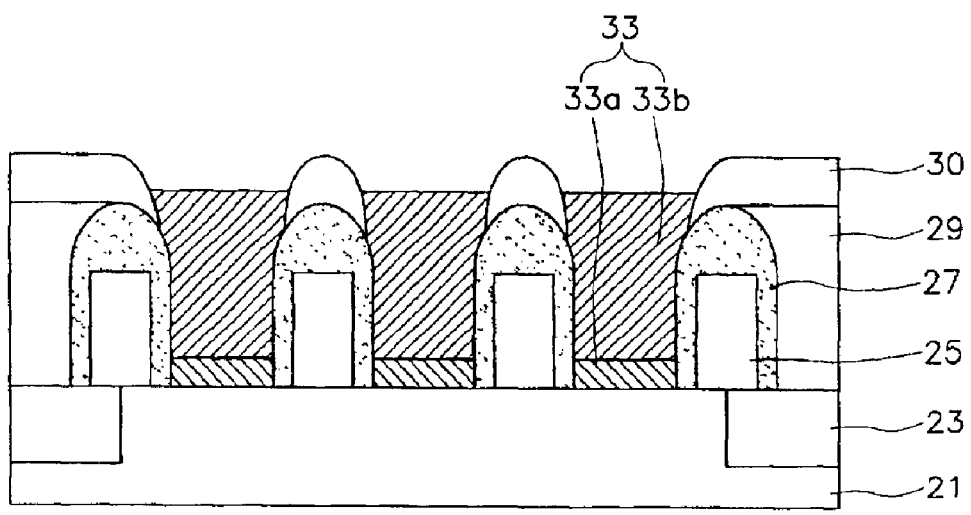

Referring now to FIG. 14, a selective silicon plug 33 is grown in the contact hole (not shown), including over the exposed surface of the nitride layer spacer 27 and the silicon substrate 21 on the side of the contact hole (not shown). The selective silicon plug 33 is grown in accordance with LPCVD or UHVCVD.

In the LPCVD method, a $DCS-H_2$—HCl gas system or $MSH_2$-HCl gas system is applied on the basis of a Si—H—Cl system.

When the $DCS-H_2$—HCl gas system is applied, the temperature is between 750 and 950° C., the pressure is between 5 and 150 Torr, the flowrate of DCS is between 0.1 and 1 slm, the flowrate of HCl is between 0.1 and 1.0 slm, and the flowrate of $H_2$ is between 30 and 150 slm.

When the $MS-H_2$—HCl gas system is applied, the temperature is between 750 and 950° C., the pressure is between 5 and 150 Torr, the flow rate of MS is between 0.1 and 1 slm, the flowrate of HCl is between 0.5 and 5.0 slm, and the flowrate of $H_2$ is between 30 and 150 slm.

In both cases, between 1 and 10% $PH_3/H_2$ is supplied at a flowrate of between 0.1 and 1.5 slm for in-situ doping process. The SEG growth target is between 60 and 100% of the width of the gate distance. For example, when the width of gate distance is 1000 Å, the SEG growth target is between 600 and 1000 Å.

Therefore, a single crystal silicon 33a is grown on the surface of the silicon substrate 21 and a polycrystalline silicon 33b is grown on the nitride layer spacer 27 of contact hole side. The contact hole is desirably filled by combining the single crystal silicon and polycrystalline silicon.

As shown in FIGS. 18 and 19, the polycrystalline silicon is grown on the nitride layer and selective single crystal silicon is grown on the exposed surface of the silicon substrate.

FIG. 20 is a TEM photograph showing the time of nucleation generation on the oxide layer pattern in the selective single crystal silicon growth in accordance with UHVCVD.

When the selective silicon plug 33 is formed by UHVCVD, incubation thickness is a maximum thickness of SEG that silicon nucleation generates on the oxide layer pattern in the SEG deposition process. The incubation thickness is generally between 800 and 1200 Å.

The thickness of SEG may be increased by adding $Cl_2$ gas, however, the growth speed is consequently lowered.

Therefore, according to the UHVCVD, $Cl_2$ can be added in order to increase the processing margin since a maximum growth speed is realized by using the incubation thickness.

The selective silicon plug 33 is deposited by using a $Si_2H_6+Cl_2+H_2$ system, wherein flow rates thereof are 1~10 sccm, 0~5 sccm, and 0~20 sccm, respectively. The deposition process is performed in-situ by using $H_2$ gas, including from 1 to 10% $PH_3$, at a temperature of between 600 and 800° C. and a pressure of between 1 and 50 mTorr.

In order to improve selectivity on the PE-USG oxide layer and increase the growth speed, $GeH_4$ may be added in the deposition of the selective silicon plug 33. The $GeH_4$ is desirably supplied at a flowrate up to 10 sccm and the growth thickness thereof is between 60 and 100% of width of the contact hole (not shown).

Referring to FIG. 21a, it is difficult to maintain selectivity on the oxide layer when interface cleaning is not completely performed and defects are also generated on the growth position of selective single crystal silicon, that is, on the silicon window.

FIG. 22b is a TEM photograph showing the surface structure when interface cleaning is completely performed. As shown in FIG. 22b, defects are not generated on the surface.

Figure 15:
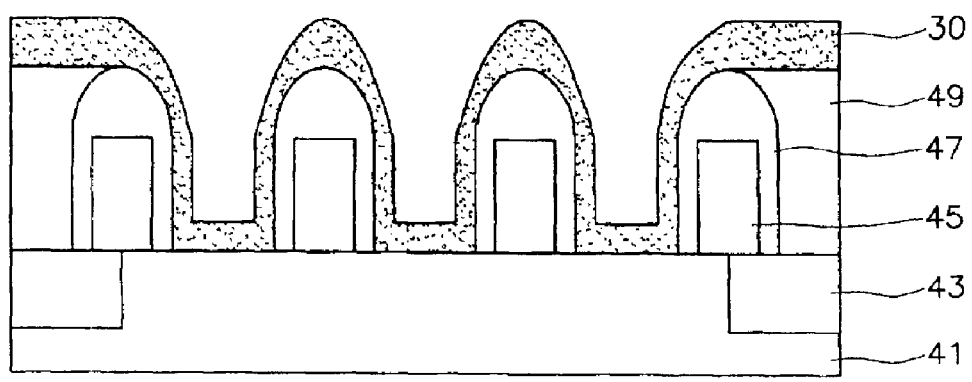
FIGS. 15 to 17 are cross sectional views showing the steps of a method of manufacturing a semiconductor device according to a third embodiment of the present invention.

According to still another embodiment of the present invention, instead of the nitride layer spacer, an oxide layer spacer 47 is formed on the upper part and the side of the gate structure 45, as shown in FIG. 15.

Then, an insulating layer 49 is deposited on the resulting structure. The insulating layer 49 is selectively removed by using SAC, thereby forming a contact hole (not shown)

exposing the oxide layer spacer 47 and silicon substrate 41, and subsequently, a nitride layer 51 is deposited on the resulting structure.

Figure 16:
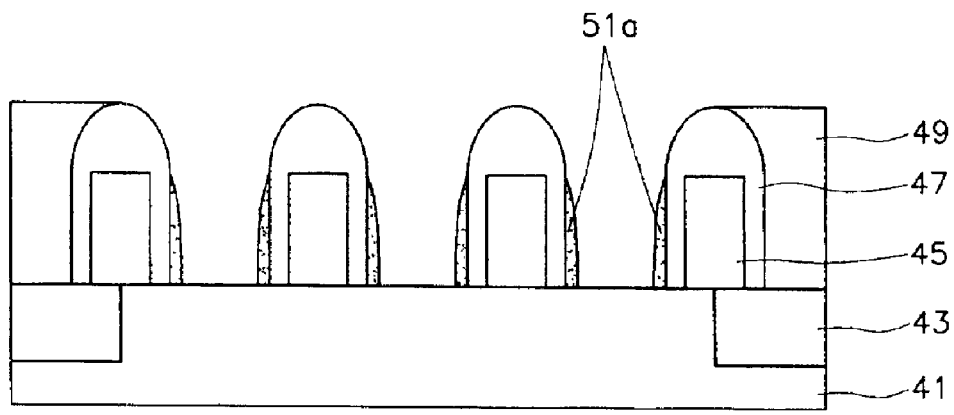

Referring to FIG. 16, the nitride layer 51 is subjected to an anisotropic etch process to form a nitride layer pattern 51a on the oxide layer spacer 47 on the side of contact hole.

Figure 17:
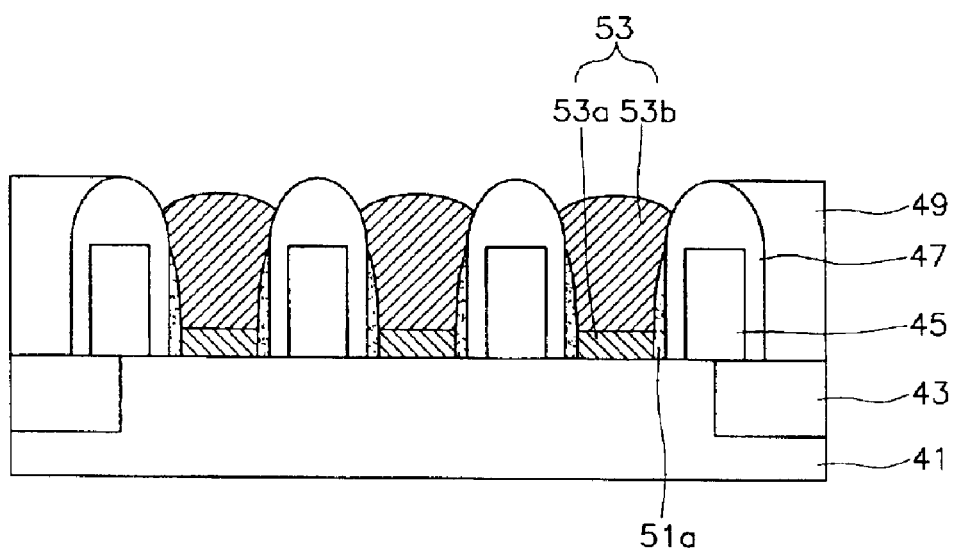

Referring to FIG. 17, a selective silicon plug 53 is formed in the contact hole including the nitride layer pattern 51a. The selective silicon plug 53 is deposited in the same method and conditions as that of other embodiments of the present invention.

Referring to FIGS. 22 and 23, polycrystalline silicon 53b is grown on the nitride layer and a selective single crystal silicon 53a is grown on the exposed surface of silicon substrate.

As described above, according to the present invention, a selective polycrystalline silicon layer is grown on the side of nitride layer spacer, SAC pattern, and selective single crystal silicon is grown on the surface of silicon substrate on the lower part of the contact hole, thereby improving the selectivity margin in the formation of selective single crystal growth and increasing the growth speed of plug.

The PE-USG oxide layer is formed on the upper part of the nitride layer spacer, SAC pattern and a nitride layer spacer formed on the side of contact hole, thereby improving the selectivity margin of the oxide layer and the nitride layer in the formation of SEG and increasing the growth speed of plug.

It is possible to simplify the manufacturing process by increasing the growth speed of silicon on the side of nitride layer spacer and permitting the possibility of SEG application.

Moreover, plug contact resistance is remarkably reduced by SEG, compared with a conventional plug using a tube polycrystalline silicon.

Therefore, the growth speed of silicon is increased on the nitride layer, thereby reducing the growth target of SSG and the processing time.

And, when defect sources due to plasma charge and bombardment are generated on the surface of the nitride layer, selectivity is increased between the nitride layer and the oxide layer, thereby improving the processing margin.

Therefore, etch damage is completely removed by the plasma treatment and epitaxial layer is grown without a H bake process.

The height of the mask nitride layer is lowered by the PE-USG oxide layer on the gate structure, thereby improving the SAC process.

There is no problem of contact hole fill due to the reduced growth target of SEG. The possibility of a bridge is also decreased since there is not much possibility of overgrowth.

Facet generation is prevented by growing silicon from the nitride layers of both sides.

Finally, it is not required to perform additional isolation processes on the cell regions and the adjacent regions since a silicon plug is not formed by a deposition process. Alternatively, the cell closing mask is employed to remove adjacent regions of the BPSG as a barrier to the cell plug and a wet cleaning process is performed by using a wet spin etcher.

Therefore, the source/drain may be formed before or after the plug is formed, since the thermal budget to the plug process is generated below 800° C.

When a UHVCVD method is applied to the present invention, the growth thickness of silicon is reduced to increase productivity. As a result, it is possible to optimize the low thermal budget process.

Moreover, the present invention has economic advantages of minimizing the silicon source for gap fill.

Although the preferred embodiment of this invention has been disclosed for illustrative purpose, those skilled in the art will appreciate that various modifications, alterations, additions and substitutions are possible, without departing from the scope and spirit of the invention, as limited by the following claims.

What is claimed is:

1. A method of manufacturing a semiconductor device comprising the steps of:
    forming an insulating layer on a silicon substrate;
    forming a contact hole in the insulating layer;
    forming a nitride layer on the wide of the contact hole; and
    forming a selective conductive plug comprising a selective single crystal silicon grown on the surface of the silicon substrate and selective polycrystalline silicon grown on the nitride layer of the side of the contact hole.

2. The method of manufacturing a semiconductor device according to claim 1, wherein the selective conductive plug is formed in accordance with LPCVD or UHVCVD.

3. A method of manufacturing a semiconductor device comprising the steps of:
    forming a gate structure on a silicon substrate;
    forming an insulating layer spacer on the gate structure;
    forming an oxide layer on the insulating layer spacer on the gate structure;
    forming an insulating layer on the silicon substrate;
    forming a contact hole in the insulating layer;
    forming a nitride layer on the side of the contact hole; and
    forming a selective conductive plug In the contact hole, including on the nitride layer, wherein the first three forming steps are performed prior to the step of forming the insulating layer on the silicon substrate.

4. The method of manufacturing a semiconductor device according to claim 3, wherein the step of forming the oxide layer comprises the steps of forming an oxide layer on the whole structure, including the insulating layer spacer, and selectively removing the oxide layer by using a wet etch process so that only the insulating layer spacer on the gate structure remains.

5. The method of manufacturing a semiconductor device according to claim 3, wherein the insulating layer spacer is an oxide layer or a nitride layer.

6. The method of manufacturing a semiconductor device according to claim 4, wherein the wet etch process is performed at a temperature of between 50 and 100° C. in distilled water mixed to a ratio of between 50 to 500 times by using a diluted HF solution.

7. The method of manufacturing a semiconductor device according to claim 4, wherein the wet etch process is performed under the conditions that $H_2SO_4$ and $H_2O_2$ solutions are maintained at the ratio of between 1:1 and 100:1 and the temperature is between 80 and 120° C., for 1 and 20 minutes.

8. The method of manufacturing a semiconductor device according to claim 5, wherein the step of forming the nitride layer is performed by forming the nitride layer on the gate structure, including over the oxide layer spacer, and then by selectively removing the nitride layer by a dry etch process.

9. The method of manufacturing a semiconductor device according to claim 8, wherein the dry etch process is performed by using $NF_3$ and $O_2$ gas plasma, under the conditions that the flow rate of $NH_3$ is between 10 and 50 sccm, the flowrate of $O_2$ is between 30 and 300 sccm, the flowrate of He is between 100 end 2000 sccm, at a power of between 1 and 200 Watts, a pressure of between 1 mTorr and 10 Torr, and a temperature of about 200° C.

10. The method of manufacturing a semiconductor device according to claim 9, wherein the in-situ cleaning process and selective conductive plug formation process are performed in the same chamber.

11. The method of manufacturing a semiconductor device according to claim 1, wherein the selective conductive plug is deposited in UHVCVD for single wafer process and in UHVCVD for tube type SEG.

12. The method of manufacturing a semiconductor device according to claim 3, further comprising the step of performing a plasma treatment on the silicon substrate having the nitride layer.

13. The method of manufacturing a semiconductor device according to claim 12, wherein the plasma treatment is performed by using a $NF_3+O_2$ processing gas, under the conditions that the flowrate of $NH_3$ is between 10 and 100 sccm, the flowrate of $O_2$ between 30 and 300 sccm, the flowrate of He is between 100 and 2000 sccm, at a power of between 1 and 200 Watts. a pressure of between 1 mTorr and 10 Torr, and a temperature of about 200° C.

14. The method of manufacturing a semiconductor device according to claim 12, wherein the selective conductive plug comprises a selective single crystal silicon grown on the surface of the silicon substrate and selective polycrystalline silicon grown on the nitride layer on contact hole side.

15. The method of manufacturing a semiconductor device according to claim 12, wherein the selective conductive plug is formed in accordance with LPCVD or UHVCVD.

16. The method of manufacturing a semiconductor device according to claim 15, wherein the LPCVD is applied by using a DCS-$H_2$—HCl gas system or MS-$H_2$—HCl gas system on the basis of a Si—H—Cl system.

17. The method of manufacturing a semiconductor device according to claim 16, wherein the DCS-$H_2$—HCl gas system is applied, under the conditions that the temperature is between 750 and 850° C., the pressure is between 5 to 760 Torr, the flow rate of DCS is between 0.1 and 1 slm, the flowrate of HCl is between 0.1 and 1.0 slm, the flowrate of $H_2$ is between 30 and 150 slm, and 1 and 10 $PH_3/H_2$ supplied at a flowrate of between 0.1 and 1.5 slm.

18. The method of manufacturing a semiconductor device according to claim 16, wherein the MS-$H_2$—HCl gas system is applied, under the conditions that the temperature is between 750 end 850° C., the pressure is between 5 and 760 Torr, the flow rate of MS is 0.1 and 1 slm, the flowrate of HCl is between 0.5 and 5.0 slm, the flowrate of $H_2$ is between 30 and 150 slm, and 1 and 10 $PH_3/H_2$ is supplied at a flowrate of between 0.1 and 1.5 slm.

19. The method of manufacturing a semiconductor device according to claim 12, further comprising the step of performing a wet cleaning process of the plasma-treated silicon substrate.

20. The method of manufacturing a semiconductor device according to claim 19, wherein the wet cleaning process comprises two steps, the first step performed, under the conditions that $H_2SO_4$ and $H_2O_2$ solutions are maintained at a ratio of between 1:1 and 100:1 and the temperature is between 80 and 120° C., for between 1 to 20 minutes, and the second step performed with a HF solution diluted in distilled water at a ratio of between 100:1 and 500:1 to remove oxide layers on the surface of silicon substrate.

21. The method of manufacturing a semiconductor device according to claim 12, wherein the contact hole is formed by a SAC method.

22. The method of manufacturing a semiconductor device according to claim 12, wherein the insulating layer is made of an oxide layer material including BPSG.

23. The method of manufacturing a semiconductor device according to claim 22, wherein the selective conductive plug is formed by using the difference of silicon growth speed in the nitride layer and in the oxide layer.

24. The method of manufacturing a semiconductor device according to claim 12, wherein the growth target of the selective conductive plug is between 60 to 100% of the width of the contact hole gap.

25. The method of manufacturing a semiconductor device according to claim 15, wherein the selective conductive plug is formed by UHVCVD using a $Si_2H_6+Cl_2+H_2$ system, the flow rate of $Si_2H_5$ is between 1 and 10sccm, the flowrate cf $Cl_2$ is up to 5sccm, the flowrate of $H_2$ is up to 20sccm, and 1 to 10% $PH_3/H_2$ is also supplied.

* * * * *